United States Patent
Yong et al.

(10) Patent No.: US 12,224,342 B2
(45) Date of Patent: Feb. 11, 2025

(54) GATE CONTACT STRUCTURE FOR A TRENCH POWER MOSFET WITH A SPLIT GATE CONFIGURATION

(71) Applicant: STMicroelectronics Pte Ltd, Singapore (SG)

(72) Inventors: Yean Ching Yong, Singapore (SG); Maurizio Gabriele Castorina, Singapore (SG); Voon Cheng Ngwan, Singapore (SG); Ditto Adnan, Singapore (SG); Fadhillawati Tahir, Singapore (SG); Churn Weng Yim, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 401 days.

(21) Appl. No.: 17/694,276

(22) Filed: Mar. 14, 2022

(65) Prior Publication Data
US 2022/0320332 A1 Oct. 6, 2022

Related U.S. Application Data

(60) Provisional application No. 63/171,163, filed on Apr. 6, 2021.

(51) Int. Cl.
*H01L 29/78* (2006.01)
*H01L 21/764* (2006.01)
(Continued)

(52) U.S. Cl.
CPC ........ *H01L 29/7813* (2013.01); *H01L 21/764* (2013.01); *H01L 21/765* (2013.01);
(Continued)

(58) Field of Classification Search
CPC . H01L 29/7813; H01L 21/764; H01L 21/765; H01L 29/0649; H01L 29/407;
(Continued)

(56) References Cited

U.S. PATENT DOCUMENTS 6,259,142 B1 7/2001 Dawson et al.
7,504,676 B2 3/2009 Bhalla et al.
(Continued)

FOREIGN PATENT DOCUMENTS

CN 103247538 A 8/2013
WO 2017070051 A1 4/2017

OTHER PUBLICATIONS

Williams, Richard K., et al: "The Trench Power MOSFET: Part I—History, Technology, and Prospects," IEEE Transactions on Electron Devices, vol. 64, No. 3, Mar. 2017.
(Continued)

*Primary Examiner* — Shahed Ahmed
*Assistant Examiner* — Khatib A Rahman
(74) *Attorney, Agent, or Firm* — Crowe & Dunlevy LLC

(57) ABSTRACT

An integrated circuit transistor device includes a semiconductor substrate providing a drain, a first doped region buried in the semiconductor substrate providing a body and a second doped region in the semiconductor substrate providing a source. A trench extends into the semiconductor substrate and passes through the first and second doped regions. An insulated polygate region within the trench surrounds a polyoxide region that may have void inclusion. The polygate region is formed by a first gate lobe and second gate lobe on opposite sides of the polyoxide region. A pair of gate contacts are provided at each trench. The pair of gate contacts includes: a first gate contact extending into the first gate lobe at a location laterally offset from the void and a
(Continued)

second gate contact extending into the second gate lobe at a location laterally offset from the void.

25 Claims, 5 Drawing Sheets

(51) Int. Cl.
 *H01L 21/765* (2006.01)
 *H01L 29/06* (2006.01)
 *H01L 29/40* (2006.01)
 *H01L 29/66* (2006.01)

(52) U.S. Cl.
 CPC ........ *H01L 29/0649* (2013.01); *H01L 29/407* (2013.01); *H01L 29/66734* (2013.01)

(58) Field of Classification Search
 CPC ......... H01L 29/66734; H01L 29/41766; H01L 29/4238; H01L 29/42376; H01L 29/7827; H01L 29/1033; H01L 29/4236
 See application file for complete search history.

(56) References Cited

U.S. PATENT DOCUMENTS

| | | | |
|---|---|---|---|
| 7,863,131 | B2 | 1/2011 | Yasui et al. |
| 8,587,054 | B2 | 11/2013 | Hsieh |
| 8,871,593 | B1 * | 10/2014 | Siemieniec ......... H01L 29/7397 |
| | | | 438/176 |
| 9,136,381 | B1 | 9/2015 | Kocon et al. |
| 9,252,239 | B2 | 2/2016 | Yilmaz et al. |
| 9,281,368 | B1 | 3/2016 | Lee et al. |
| 9,390,927 | B2 | 7/2016 | Chuang et al. |
| 9,595,587 | B2 | 3/2017 | Lee et al. |
| 10,714,574 | B2 | 7/2020 | Yilmaz |
| 10,720,524 | B1 | 7/2020 | Qiao et al. |
| 10,777,661 | B2 | 9/2020 | Yilmaz |
| 10,923,399 | B2 | 2/2021 | Xiao et al. |
| 2009/0152624 | A1 | 6/2009 | Hiller et al. |
| 2013/0341710 | A1 | 12/2013 | Choi et al. |
| 2014/0295658 | A1 | 10/2014 | Blank et al. |
| 2019/0088776 | A1 | 3/2019 | Shimomura et al. |
| 2020/0295150 | A1 * | 9/2020 | Nishiwaki ......... H01L 29/66727 |

OTHER PUBLICATIONS

EP Search Report and Written Opinion for counterpart EP Appl. No. 22166429.5, report dated Sep. 6, 2022, 11 pgs.

* cited by examiner

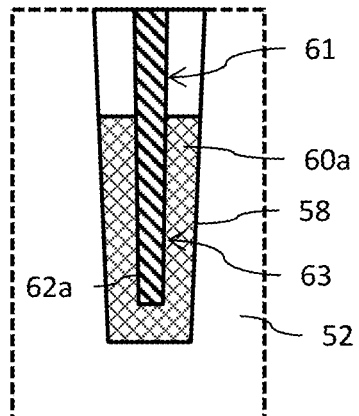
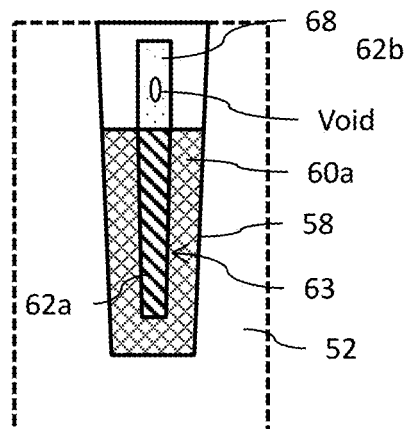
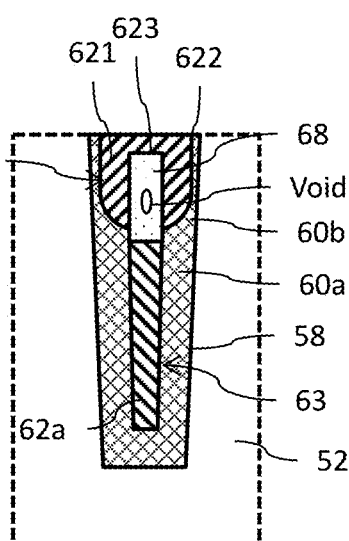
FIG. 3A    FIG. 3B    FIG. 3C
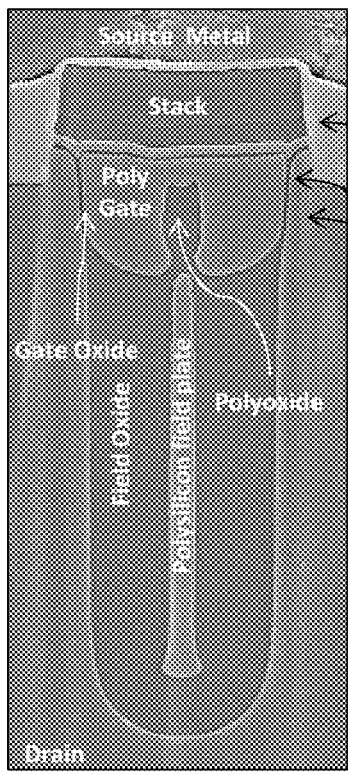
FIG. 4A
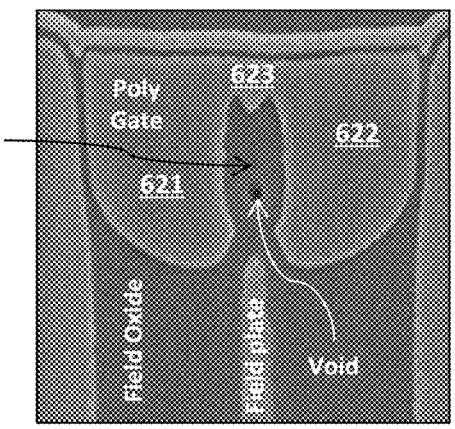
FIG. 4B
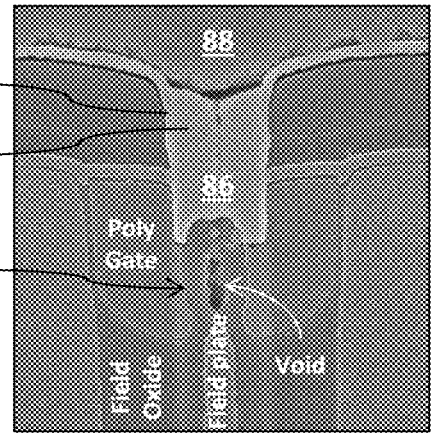
FIG. 4C

Field plate

Field plate trench pair of gate contacts (861, 862)

trench pair of gate contacts (861, 862)

GATE CONTACT STRUCTURE FOR A TRENCH POWER MOSFET WITH A SPLIT GATE CONFIGURATION

CROSS REFERENCE TO RELATED APPLICATIONS

This application claims priority from United States Provisional Application for Patent No. 63/171,163, filed Apr. 6, 2021, the disclosure of which is incorporated herein by reference.

TECHNICAL FIELD

Embodiments herein generally relate to metal oxide semiconductor field effect transistor (MOSFET) devices and, in particular, to a gate contact structure for a trench-type power MOSFET having a split gate configuration including a pair of polysilicon gate lobes laterally separated by a polyoxide region and electrically coupled by a polysilicon gate bridge.

BACKGROUND

Reference is made to FIG. 1 which shows a cross-section of a power metal oxide semiconductor field effect transistor (MOSFET) device 10. In this example, the MOSFET is an n-channel (nMOS) type device formed in and on a semiconductor substrate 12 doped with n-type dopant which provides the drain of the transistor 10. The substrate 12 has a front side 14 and a back side 16. A plurality of trenches 18 extend depthwise into the substrate 12 from the front side 14. The trenches 18 extend lengthwise (i.e., longitudinally) parallel to each other in a direction perpendicular to the cross-section (i.e., into and out of the page of the illustration) and form strips (this type of transistor device commonly referred to in the art as a strip-FET type transistor).

A region 24 doped with a p-type dopant is buried in the substrate 12 at a depth offset from (i.e., below) the front side 14 and positioned extending parallel to the front side 14 on opposite sides of each trench 18. The doped region 24 forms the body (channel) region of the transistor, with the trench 18 passing completely through the doped body region 24 and into the substrate 12 below the doped body region 24. A surface implant region 26 heavily doped with an n-type dopant is provided at the front side 14 of the substrate 12 and positioned extending parallel to the front side 14 on opposite sides of each trench 18 and in contact with the top of the doped body region 24. The doped region 26 forms the source of the transistor, with the trench 18 passing completely through the doped source region 26 and further extending, as noted above, completely through the doped body region 24 into the substrate 12 below the doped body region 24.

The side walls and bottom of each trench 18 are lined with an insulating layer 20. For example, the insulating layer 20 may comprise an oxide layer (which, in an embodiment, is thermally grown from the exposed surfaces of the substrate 12 in each trench 18). Each trench 18 is filled by a polysilicon material 22, with the insulating layer 20 insulating the polysilicon material 22 from the substrate 12. The polysilicon material 22 forms the gate (referred to as a polygate) of the transistor 10 and the insulating layer 20 is the gate oxide layer.

A stack 30 of layers is formed above the upper surface of the substrate. The stack 30 includes an undoped oxide (for example, tetraethyl orthosilicate (TEOS)) layer 32 and a glass (for example, borophosphosilicate glass (BPSG)) layer 34. The stack 30 may further include additional insulating and/or barrier layers if needed.

With reference to the left side of FIG. 1, a source metal contact 40 extends through the layers of the stack 30, positioned between the locations of adjacent trenches 18, to make electrical contact with the doped source region 26. Each source metal contact 40 extends depthwise into the substrate to pass through the doped source region 26 and partially into the doped body region 24 (thus providing a body contact for the transistor 10 that is tied to the source). A source metal layer 42 extends over both the stack 30 and the source metal contacts 40 to provide an electrical connection to and between all source metal contacts 40. The layers of the stack 30 insulate both the source metal layer 42 and the source metal contacts 40 from the polygate (polysilicon region 22).

With reference now to the right side of FIG. 1, a gate metal contact 46 extends through the layers of the stack 30, positioned in alignment with the locations of the trenches 18, to make electrical contact with the polysilicon region 22 in each trench 18. Although not explicitly illustrated, it will be understood that the gate metal contact 46 may extend depthwise at least partially into the polysilicon region 22. A gate metal layer 48 extends over both the stack 30 and the gate metal contacts 46 to provide an electrical connection to and between all gate metal contacts 46. The layers of the stack 30 insulate both the gate metal layer 48 and the gate metal contacts 46 from the source metal contacts and source regions.

The cross-sections on the left and right sides of FIG. 1 are in practice actually longitudinally offset from each other in the direction perpendicular to the cross-section (i.e., into and out the page of the illustration). In this configuration, an insulating separation is provided between the source metal layer 42 and the gate metal layer 48.

A drain metal layer 44 extends over the back side 16 of the substrate 12 to provide a metal connection to the drain.

The transistor 10 could instead be a pMOS type transistor where the substrate 12 and doped source region 16 are both p-type doped and the body region 14 is n-type doped.

Reference is now made to FIG. 2 which shows a cross-section of a power metal oxide semiconductor field effect transistor (MOSFET) device 50. In this example, the MOSFET is an n-channel (nMOS) type device formed in and on a semiconductor substrate 52 doped with n-type dopant which provides the drain of the transistor 50. The substrate 52 has a front side 54 and a back side 56. A plurality of trenches 58 extend depthwise into the substrate 52 from the front side 54. The trenches 58 extend lengthwise (i.e., longitudinally) parallel to each other in a direction perpendicular to the cross-section (i.e., into and out the page of the illustration) and form strips (this type of transistor device commonly referred to in the art as a strip-FET type transistor).

A region 64 doped with a p-type dopant is buried in the substrate 52 at a depth offset from (i.e., below) the front side 54 and positioned extending parallel to the front side 54 on opposite sides of each trench 58. The doped region 64 forms the body (channel) region of the transistor, with the trench 58 passing completely through the doped body region 64 and into the substrate 52 below the doped body region 64. A region 66 doped with an n-type dopant is provided at the front side 54 of the substrate 52 and positioned extending parallel to the front side 54 on opposite sides of each trench 58 and in contact with the top of the doped body region 64. The doped region 66 forms the source of the transistor, with the trench 58 passing completely through the doped source region 66 and further extending, as noted above, completely through the doped body region 64 into the substrate 52 below the doped body region 64.

The side walls and bottom of each trench 58 are lined with a first (thick) insulating layer 60*a*. For example, the insulating layer 60*a* may comprise a thick oxide layer. The trench 58 is then filled by a first polysilicon material 62*a*, with the insulating layer 60*a* insulating the first polysilicon material 62*a* from the substrate 52. The polysilicon material 62*a* is a heavily n-type doped polysilicon material (for example, Phosphorus doped with a doping concentration of $5 \times 10^{20}$ at/cm$^3$). During the process for fabricating the transistor 50, an upper portion of the insulating layer 60*a* (which would be adjacent to both the doped body region 64 and doped region 66) is removed from the trench 58 to expose a corresponding upper portion 61 of the polysilicon material 62*a* (see, FIG. 3A). This exposed upper portion 61 of the polysilicon material 62*a* is then converted (for example, using a thermal oxidation process) to form a polyoxide region 68 that is vertically aligned in the trench 58 with the remaining (lower) portion 63 of the polysilicon material 62*a* (See, FIG. 3B). This remaining lower portion 63 of the polysilicon material 62*a* forms a field plate electrode of the transistor 50 (referred to also as the polysource region because it is typically electrically shorted to the source region 66—this electrical connection is not explicitly shown in the figures). The side walls and bottom of the upper portion of each trench 58 are then lined with a second (thin) insulating layer 60*b* (see, FIG. 3C). For example, the insulating layer 60*b* may comprise a thermally grown thin oxide layer. The upper portion of each trench 58 is then filled by a second polysilicon material 62*b*, with the insulating layer 60*b* insulating the second polysilicon material 62*b* from the substrate 52 (including regions 64 and 66). The second polysilicon material 62*b* forms the gate (referred to also as a polygate region) of the transistor 50 and includes a first (for example, left) gate lobe 621 and second (for example, right) gate lobe 622 which extend on opposite sides of the polyoxide region 68. The first and second gate lobes are electrically coupled by a gate bridge portion 623 extending over the polyoxide region 68. The insulating layer 60*b* forms the gate oxide layer.

A stack 70 of layers is formed above the upper surface of the substrate. The stack 70 includes an undoped oxide (for example, tetraethyl orthosilicate (TEOS)) layer 72 and a glass (for example, borophosphosilicate glass (BPSG)) layer 74. The stack 70 may further include additional insulating and/or barrier layers if needed.

With reference to the left side of FIG. 2, a source metal contact 80 extends through the layers of the stack 70, positioned between the locations of adjacent trenches 58, to make electrical contact with the doped source region 66. Each source metal contact 80 extends depthwise into the substrate to pass through the doped source region 66 and partially into the doped body region 64 (thus providing a body contact for the transistor 50 that is tied to the source). A source metal layer 82 extends over both the stack 70 and the source metal contacts 80 to provide an electrical connection to and between all source metal contacts 80. The layers of the stack 70 insulate both the source metal layer 82 and the source metal contacts 80 from the polygate (second polysilicon region 62*b*).

With reference now to the right side of FIG. 2, a gate metal contact 86 extends through the layers of the stack 70, positioned in alignment with the locations of the trenches 58, to make electrical contact with the second polysilicon region 62*b* in each trench 58 (for example, by making contact at the location of the bridge portion 623). It will be noted that the gate metal contact 86 preferably extends depthwise at least partially into the filled trench, for example extending into at least the upper part of the bridge portion 623 (and perhaps extending completely through the bridge portion). A gate metal layer 88 extends over both the stack 70 and the gate metal contacts 86 to provide an electrical connection to and between all gate metal contacts 86. The layers of the stack 70 insulate both the gate metal layer 88 and the gate metal contacts 86 from the source metal contacts and source regions. The polyoxide region 68 insulates the polysource region 62*a* from the gate metal contact 86.

The cross-sections on the left and right sides of FIG. 2 are in practice actually longitudinally offset from each other in the direction perpendicular to the cross-section (i.e., into and out the page of the illustration). In this configuration, an insulating separation is provided between the source metal layer 82 and the gate metal layer 88.

A drain metal layer 84 extends over the back side 56 of the substrate 52 to provide a metal connection to the drain.

The transistor 50 could instead be a pMOS type transistor where the substrate 52 and doped source region 56 are both p-type doped and the body region 54 is n-type doped.

FIG. 4A shows a scanning electron micrograph (SEM) cross-sectional image of a single cell of the transistor 50 corresponding to the left side of FIG. 2.

During the formation of the polyoxide region 68 (see, FIG. 3B), there is a lateral and vertical material expansion as the polysilicon material 62*a* is converted into the polyoxide region 68. This expansion induces a tension which can produce a void (or seam or cavity) within the polyoxide material. The existence and location of such voids in the polyoxide region 68 is unpredictable. FIG. 4B shows a scanning electron micrograph (SEM) cross-sectional image focusing on the region where the trench 58 is located to illustrate by example the existence of such a void (see, also, FIG. 3B). Depending on the width of the trench 58 and the size of the polygate formed by lobes 621, 622 and bridge 623, the void in the polyoxide region 68 may extend close to the inner surface of the polygate (see, FIG. 3C) and this can have an impact on the formation of the gate contact 86 and, as will be discussed below, increase the risk of the formation of a short to the source through the polysource region 62*a*.

The process for formation of the gate contact 86 utilizes a mask with a mask opening aligned with the center of the trench 58. An etch performed using this mask produces a gate opening extending through the stack 70 and at least partially into, if not completely through, the bridge 623 of the second polysilicon region 62*b* which forms the polygate. That etch may include multiple, discrete, etch steps including a first etch to remove the layers of the stack 70 and a second etch to extend into the bridge 623 for a desired depth. The size of the mask opening, and the corresponding gate opening, is typically designed to be about, and more preferably less than, one-half the size (width) of the trench 58 and is generally speaking preferably aligned with the center of the trench. A barrier layer 92 formed of a Titanium-Titanium Nitride (Ti—TiN) material is then conformally deposited into the etched gate opening, and the gate opening is then filled with a plug 94 made of a conductive material (such as, for example, Tungsten) to form the gate contact 86. FIG. 4C shows a scanning electron micrograph (SEM) cross-sectional image focusing on the gate contact 86 and illustrating that the gate opening has passed completely through the gate bridge 623 to reach the polyoxide region 68.

Control over the depth of the second etch is difficult to ensure, and the possible existence and location of the void in the polyoxide region 68 is difficult to predict. There accordingly exists a non-negligible risk that the second etch will pass completely through the bridge 623, with the gate opening extending partially into polyoxide region 68 to reach the void. The conformally deposited Ti—TiN barrier layer may not adequately cover this location due to the difficult topology presented by the void in combination with the gate opening, and thus the conductive material for the plug that is deposited in the gate opening may encroach into the void and potentially short-circuit the polygate to the polysource provided by the field plate (which, as noted above, is electrically connected to the source region).

There exists a need to address the foregoing problem in power MOSFET devices and provide a better solution for making electrical contact to a split gate configuration including a pair of polysilicon gate lobes laterally separated by a polyoxide region and electrically coupled by a polysilicon gate bridge.

SUMMARY

In an embodiment, an integrated circuit transistor device comprises: a semiconductor substrate providing a drain; a first doped region buried in the semiconductor substrate providing a body; a second doped region in the semiconductor substrate providing a source, wherein the second doped region is adjacent the first doped region; a trench extending into the semiconductor substrate and passing through the first and second doped regions; a polyoxide region within the trench; a polygate region within the trench, said polygate region comprising: a first gate lobe on a first side of the polyoxide region and a second gate lobe on a second side of the polyoxide region opposite said first side; an insulating layer extending over the first doped region and trench; and a pair of gate contacts for said trench. The pair of gate contacts comprises: a first gate contact extending through the insulating layer and into the first gate lobe; and a second gate contact extending through the insulating layer and into the second gate lobe.

In an embodiment, an integrated circuit transistor device comprises: a semiconductor substrate providing a drain; a first doped region buried in the semiconductor substrate providing a body; a second doped region in the semiconductor substrate providing a source, wherein the second doped region is adjacent the first doped region; a trench extending into the semiconductor substrate and passing through the first and second doped regions; an insulated polysource region within the trench; a polyoxide region within the trench and aligned with said insulated polysource region, wherein said polyoxide region includes void; a first insulated gate lobe on a first side of the polyoxide region; a second insulated gate lobe on a second side of the polyoxide region opposite said first side; a first gate contact extending into the first gate lobe, said first gate contact laterally offset from a longitudinal center of the trench such that a depth of the first gate contact does not reach said void; and a second gate contact extending into the second gate lobe, said second gate contact laterally offset from the longitudinal center of the trench such that a depth of the second gate contact does not reach said void.

BRIEF DESCRIPTION OF THE DRAWINGS

For a better understanding of the embodiments, reference will now be made by way of example only to the accompanying figures in which:

FIGS. 3A-3C show process steps in the manufacture of the power MOSFET device of FIG. 2;

FIGS. 4A-4C are scanning electron micrograph images of a cross-section of the power MOSFET device of FIG. 2;

DETAILED DESCRIPTION

For the discussion herein, it will be noted that the term "longitudinal" refers to a first direction for example extending along the length of the trench and the term "lateral" refers to a second direction for example extending along the width of the trench. The longitudinal and lateral directions are perpendicular to each other and extend parallel to an upper surface of the semiconductor substrate.

Figure 5:
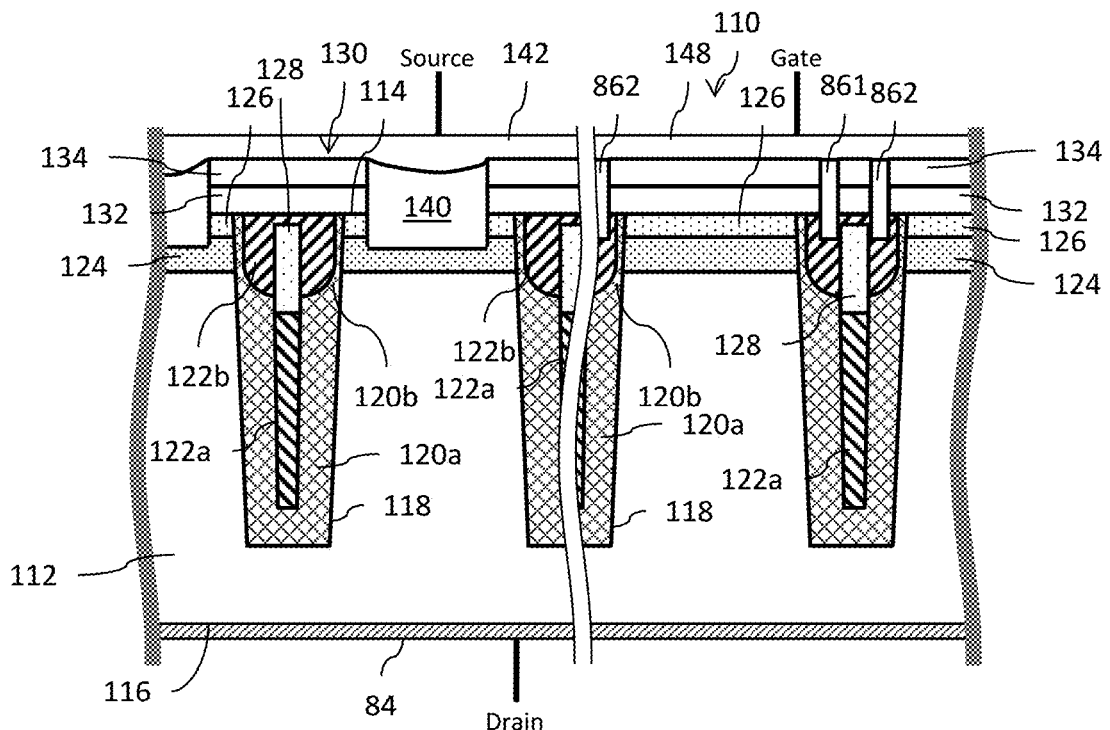
FIG. 5 is a cross-section of a power MOSFET device.

Reference is now made to FIG. 5 which shows a lateral cross-section of a power metal oxide semiconductor field effect transistor (MOSFET) device 110. In this example, the MOSFET is an n-channel (nMOS) type device formed in and on a semiconductor substrate 112 doped with n-type dopant which provides the drain of the transistor 110. The substrate 112 has a front side 114 and a back side 116. A plurality of trenches 118 extend depthwise into the substrate 112 from the front side 114. The trenches 118 longitudinally extend with a desired length parallel to each other in a direction perpendicular to the cross-section (i.e., into and out of the page of the illustration) and form strips (this type of transistor device commonly referred to in the art as a strip-FET type transistor).

A region 124 doped with a p-type dopant is buried in the substrate 112 at a depth offset from (i.e., below) the front side 114 and positioned laterally extending parallel to the front side 114 on opposite sides of each trench 118. The doped region 124 forms the body (channel) region of the transistor, with the trench 118 passing completely through the doped body region 124 and into the substrate 112 below the doped body region 124. A surface implant region 126 doped with an n-type dopant is provided at the front side 114 of the substrate 112 and positioned extending parallel to the front side 114 on opposite sides of each trench 118 and in contact with the top of the doped body region 124. The doped region 126 forms the source of the transistor, with the trench 118 passing completely through the doped source region 126 and further extending, as noted above, completely through the doped body region 124 into the substrate 112 below the doped body region 124.

The side walls and bottom of each trench 118 are lined with a first insulating layer 120a. For example, the insulating layer 120a may comprise a thick oxide layer. The trench 118 is then filled by a first polysilicon material 122a, with the insulating layer 120a insulating the first polysilicon material 122a from the substrate 112. The first polysilicon material 122a is a heavily n-type doped polysilicon material (for example, Phosphorus doped with a doping concentration of $5 \times 10^{20}$ at/cm$^3$). During the process for fabricating the transistor 110, an upper portion of the insulating layer 120a (which would be adjacent to both the doped body region 124 and doped region 126) is removed from the trench 118 to expose a corresponding upper portion of the first polysilicon material 122a. This exposed upper portion of the first polysilicon material 122a is then converted (for example, using a thermal oxidation process) to form a polyoxide region 128 that is vertically aligned in the trench 118 with the remaining (lower) portion of the first polysilicon material 122a. This remaining lower portion of the first polysilicon material 122a forms a field plate electrode of the transistor 110 (referred to also as the polysource region because it is typically electrically shorted to the source region 126—this electrical connection is not explicitly shown in the figures). The side walls and bottom of the upper portion of each trench 118 are then lined with a second insulating layer 120b. For example, the insulating layer 120b may comprise a thermally grown oxide layer. The upper portion of each trench 118 is then filled by a second polysilicon material 122b, with the insulating layer 120b insulating the second polysilicon material 122b from the substrate 112 (including regions 124 and 126). The second polysilicon material 122b forms the gate (referred to as a polygate region) of the transistor 110 and includes a first (for example, left) gate lobe 621 and second (for example, right) gate lobe 622 which longitudinally extend in the trench on opposite sides of the polyoxide region 128. The first and second gate lobes are connected by a gate bridge portion 623 laterally extending over the polyoxide region 128. The insulating layer 120b forms the gate oxide layer.

A stack 130 of layers is formed above the upper surface of the substrate. The stack 130 includes an undoped oxide (for example, tetraethyl orthosilicate (TEOS)) layer 132 and a glass (for example, borophosphosilicate glass (BPSG)) layer 134. The stack 130 may further include additional insulating and/or barrier layers if needed.

With reference to the left side of FIG. 5, a source metal contact 140 extends through the layers of the stack 130, positioned between the locations of adjacent trenches 118, to make electrical contact with the doped source region 126. Each source metal contact 140 extends depthwise into the substrate to pass through the doped source region 136 and partially into the doped body region 134 (thus providing a body contact for the transistor 110 that is tied to the source). A source metal layer 142 extends over both the stack 130 and the source metal contacts 140 to provide an electrical connection to and between all source metal contacts 140. The layers of the stack 130 insulate both the source metal layer 142 and the source metal contacts 140 from the polygate (second polysilicon region 122b).

With reference now to the right side of FIG. 5, the gate metal contact for each polygate is formed by a pair of contacts 861 and 862, where each contact 861, 862 extends through the layers of the stack 130, positioned in vertical alignment with the location of a corresponding lobe 621, 622 (respectively) of the polygate, to make electrical contact with the respective lobe of the second polysilicon region 122b in each trench 118. In a preferred implementation, each gate metal contact 861, 862 extends depthwise at least partially into an upper portion of the corresponding lobe 621, 622 on either side of the bridge 623. A gate metal layer 148 extends over both the stack 130 and the gate metal contacts 861, 862 to provide an electrical connection to and between all gate metal contacts 861, 862. The layers of the stack 130 insulate both the gate metal layer 148 and the gate metal contacts 861, 862 from the source metal contacts and source regions. It will be noted that a portion of the stack serves to laterally insulate the contact 861 from the contact 862 at the level of layers within the stack.

The cross-sections on the left and right sides of FIG. 5 are, in practice, actually longitudinally offset from each other in the direction perpendicular to the cross-section (i.e., into and out of the page of the illustration). In this configuration, an insulating separation is provided between the source metal layer 142 and the gate metal layer 148.

A drain metal layer 144 extends over the back side 116 of the substrate 112 to provide a metal connection to the drain.

The transistor 110 could instead be a pMOS type transistor where the substrate 112 and doped source region 126 are both p-type doped and the body region 124 is n-type doped.

Figure 1:
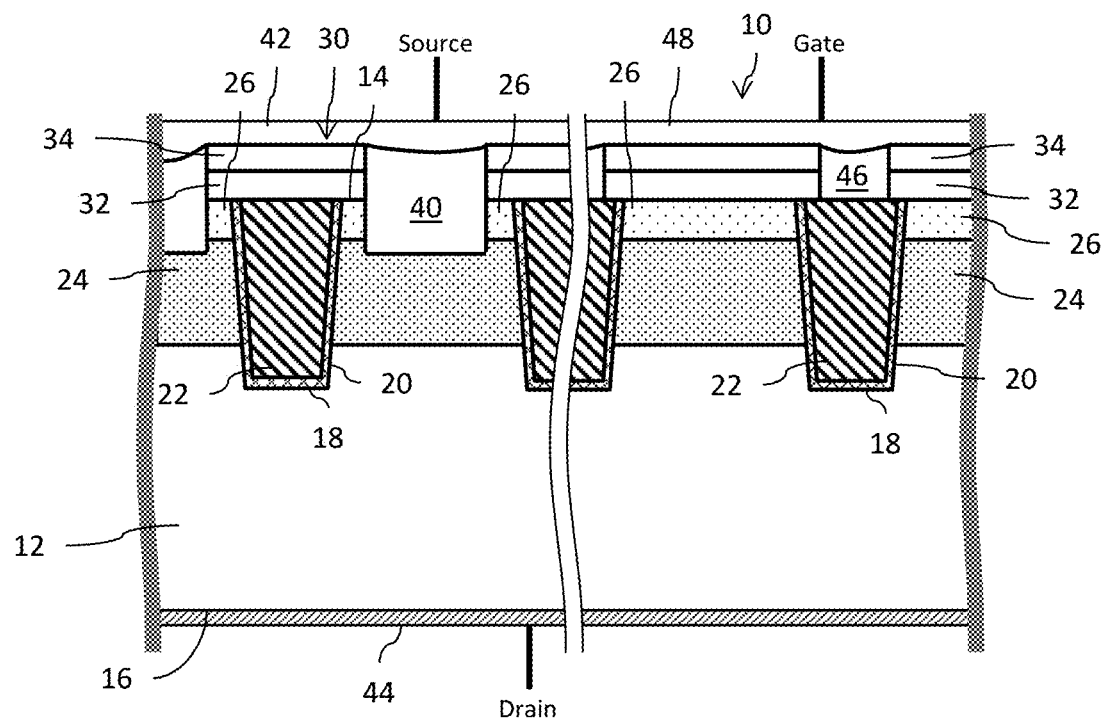
FIG. 1 is a cross-section of a power metal oxide semiconductor field effect transistor (MOSFET) device.
Figure 2:
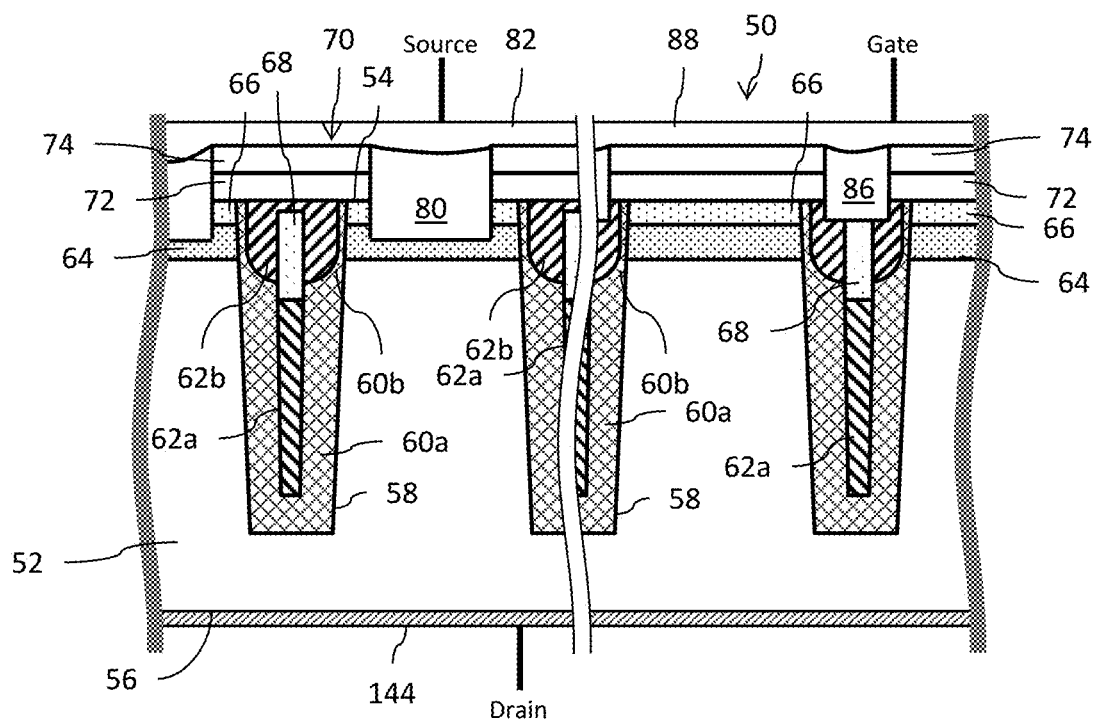
FIG. 2 is a cross-section of a power MOSFET device.
Figure 6A:
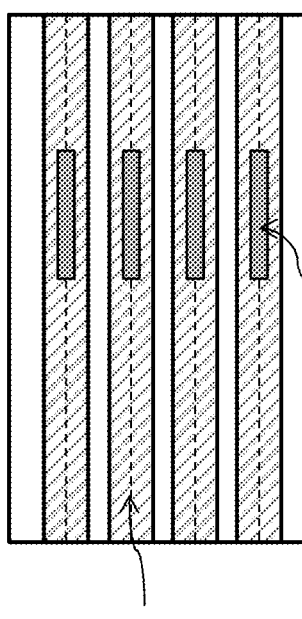
FIGS. 6A and 6B illustrate gate contact layout configurations for the power MOSFET devices of FIGS. 2 and 5, respectively.
Figure 6B:
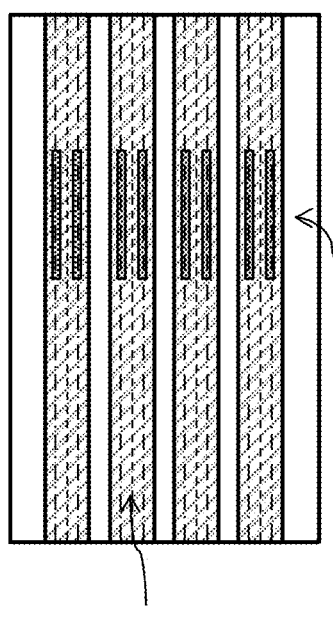

FIGS. 6A and 6B are plan views (i.e., looking downward towards the front surface of the substrate) comparing layouts for the transistors 50 and 110 with a specific focus showing the relative locations of the contacts 86 and the pair of contacts 861 and 862. The dotted line indicates the center line of each longitudinally extending trench, and the dash-dot line indicates the general location of the longitudinal center of each lobe of the polygate. FIG. 6A generally corresponds to the implementation shown on the right side of FIG. 2, while FIG. 6B generally corresponds to the implementation shown on the right side of FIG. 5. Although only one pair of contacts 861 and 862 per trench is shown in FIG. 6B, it will be understood that this is by example only and that more than one pair per trench may be used if desired.

The structure of the gate contact shown in FIG. 5 which utilizes a pair of side-by-side arranged contacts 861 and 862 addresses the concerns with problems that may arise in connection with the polyoxide region 148 possibly including a void. The combined size of the pair of contacts 861 and 862 is, preferably, substantially equal to the size of the gate contact 86 shown in FIG. 2, and thus will provide substantially identical performance in terms of gate resistance. Splitting of each gate contact into two parts (contacts 861 and 862) and vertically aligning each part with a corresponding lobe 621, 622 of the polygate avoids making contact with the polygate in the center portion of the trench (i.e., at the location of the gate bridge region) and thus minimizes the risk that the etch used to form the contact openings will reach the void location.

In this FIG. 5 embodiment, each contact 861, 862 may have a length dimension (in the longitudinal direction) of between 0.1 μm and 10 μm and a width dimension (perpendicular to the length dimension in the lateral direction) of between 0.1 μm and 1 μm.

It will be noted that in the implementation shown in FIG. 5, with a lateral side-by-side arrangement of the pair of contacts 861, 862 the cross-section at a given location longitudinally along the length of the trench passes through both of the contacts 861, 862. The fabrication of a device having such an implementation requires that the gate mask include a very thin resist portion aligned with the spacing between the adjacent contacts at that given location. It is possible that this very thin resist portion could lift off during fabrication processing and adversely affect the accuracy of the etching operation to form the gate contact openings. For example, malformed openings for each of the gate contacts could occur, or a merger of the two separate openings for the side-by-side pair of contacts into one large opening could occur. A solution to this concern is to instead design the gate mask so that the individual mask openings for producing the contacts 861, 862 are longitudinally offset from each other in the direction perpendicular to the cross-section (i.e., into and out of the page of the illustration).

Figure 7:
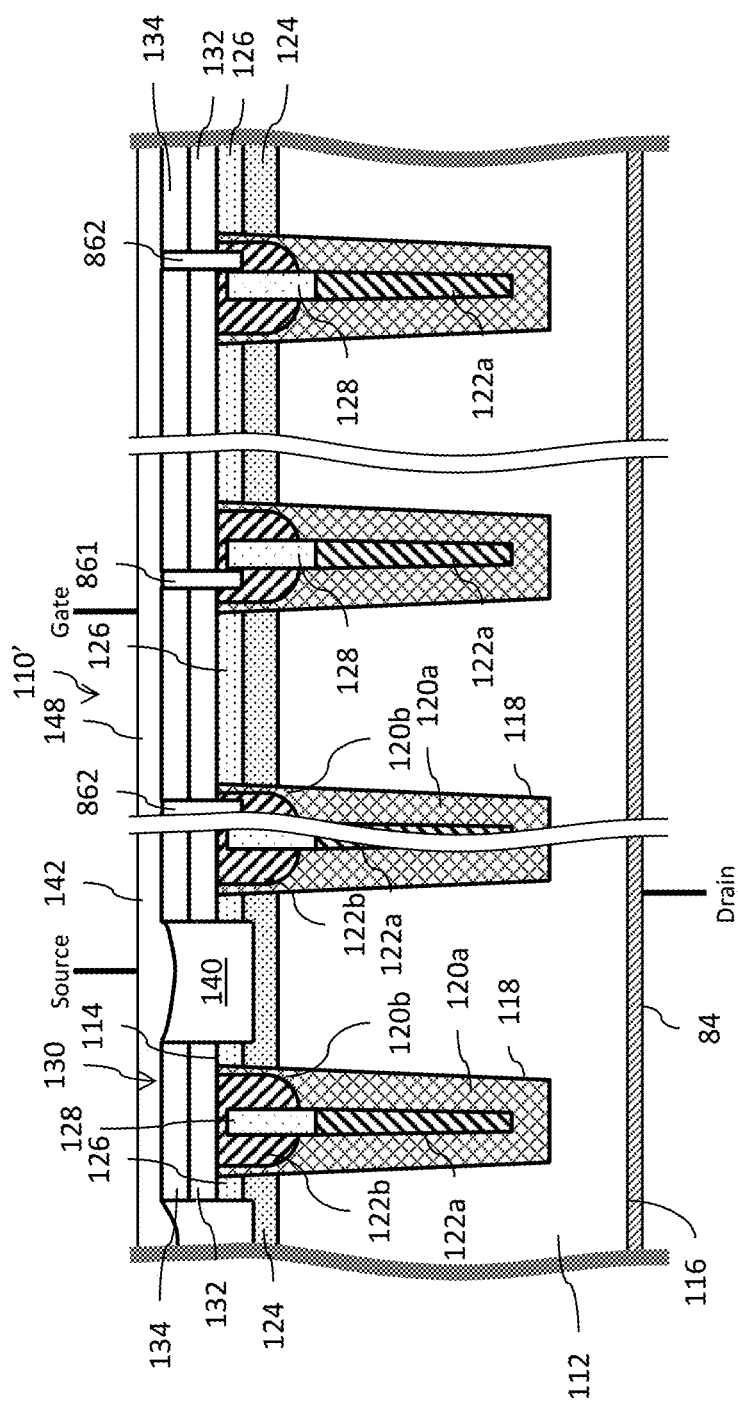
FIG. 7 is a cross-section of a power MOSFET device.

A transistor 110' structure resulting from such an arrangement of the mask openings is shown in FIG. 7. Like references in FIG. 7 refer to like or similar parts as shown in FIG. 5. The left side of FIG. 7 corresponds to the left side of FIG. 5. The middle and right portions of FIG. 7 illustrate the longitudinal offsetting of the gate contacts 861 and 862 for a given trench which result from a corresponding longitudinal offsetting of the mask openings. In particular, the middle portion of FIG. 7 shows the cross section at locations where the mask openings for forming the first gate contacts 861 have been utilized so as to make electrical contact to the corresponding first (left) lobe 621 of the polygate. The right portion of FIG. 7 shows the cross section at locations where the mask openings for forming the second gate contacts 862 have been utilized so as to make electrical contact to the corresponding second (right) lobe 622 of the polygate. Notwithstanding the longitudinal offset of the individual gate openings, it will be noted that each gate contact to a polygate within the trench is still formed by a pair of contacts 861 and 862.

In this FIG. 7 embodiment, each contact 861, 862 may have a length dimension (in the longitudinal direction) of between 0.1 μm and 10 μm and a width dimension (perpendicular to the length dimension in the lateral direction) of between 0.1 μm and 1 μm. It will be noted that with the longitudinal offsetting of the contacts 861, 862 in FIG. 7, each individual contact may be fabricated to have a wider width than the corresponding contact for the FIG. 5 embodiment where the side-by-side arrangement may impose a constraint on contact width.

Figure 8A:
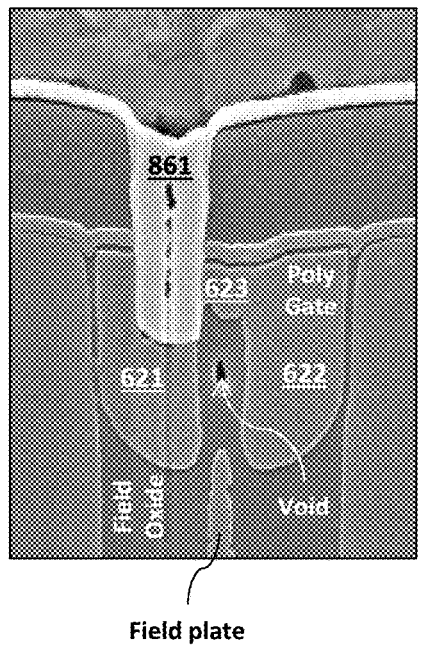
FIGS. 8A-8B are scanning electron micrograph images of a cross-section of the power MOSFET device of FIG. 7.

FIG. 8A shows a scanning electron micrograph (SEM) cross-sectional image of a single cell of the transistor 110' corresponding to the middle of FIG. 7 and focusing on the gate contact 861 for lobe 621 of the polygate.

Figure 8B:
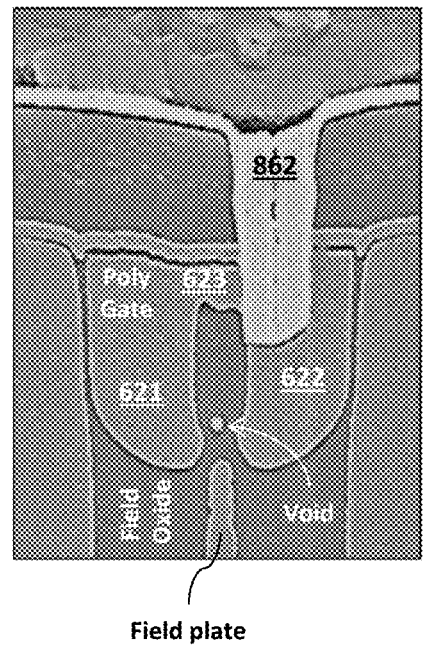

FIG. 8B shows a scanning electron micrograph (SEM) cross-sectional image of a single cell of the transistor 110' corresponding to the right side of FIG. 7 and focusing on the gate contact 862 for lobe 622 of the polygate.

Figure 9A:
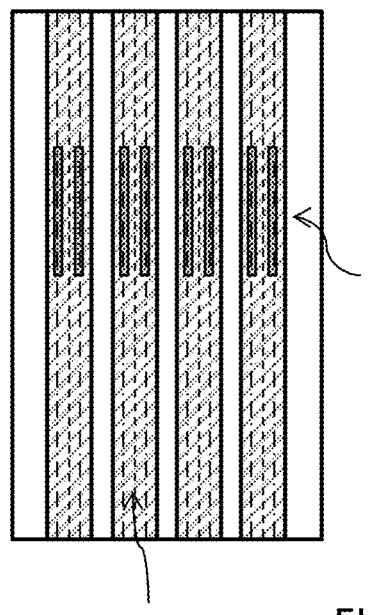
FIGS. 9A and 9B illustrate gate contact layout configurations for the power MOSFET devices of FIGS. 5 and 7, respectively.
Figure 9B:
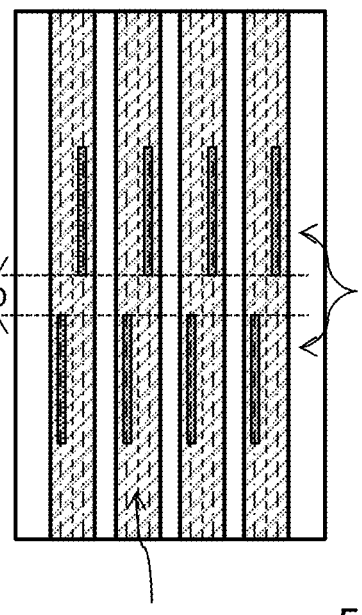

FIGS. 9A and 9B are plan views (i.e., looking downward towards the front surface of the substrate) comparing layouts for the transistors 110 and 110' with a specific focus showing the relative locations of the pair of contacts 861 and 862. The dotted line indicates the center line of each longitudinally extending trench, and the dash-dot line indicates the general location of the center of each lobe of the polygate. It will be noted that a longitudinal center of each contact 861, 862 is positioned between the longitudinal center of the corresponding gate lobe and the longitudinal center of the trench. This ensures that placement of the contact does not risk bridging across the gate oxide and shorting the polygate to the doped source region. FIG. 9A generally corresponds to the implementation shown on the left side of FIG. 7, while FIG. 9B generally corresponds to the implementation shown on the middle and right side of FIG. 7. Although only one pair of contacts 861 and 862 per trench is shown in FIGS. 9A and 9B, it will be understood that this is by example only and that more than one pair per trench may be used if desired. From FIG. 9B, it will be noted that the longitudinal offset of the pair of contacts 861 and 862 of a given trench is such that no cross section through that given trench in a plane perpendicular to the longitudinal direction of the given trench will pass through both the first gate contact and the second gate contact. This is effectuated by setting a sufficient longitudinal offset distance D between the end of the first gate contact and the adjacent end of the second gate contact in the longitudinal direction of the trench.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit transistor device, comprising:
a semiconductor substrate providing a drain;
a first doped region buried in the semiconductor substrate providing a body;
a second doped region in the semiconductor substrate providing a source, wherein the second doped region is adjacent the first doped region;
a trench extending into the semiconductor substrate and passing through the first and second doped regions;
a polyoxide region within the trench;
a polygate region within the trench, said polygate region comprising: a first gate lobe on a first side of the polyoxide region and a second gate lobe on a second side of the polyoxide region opposite said first side;
an insulating layer extending over the first doped region and trench; and
a pair of gate contacts for said trench, said pair of gate contacts comprising:
a first gate contact extending through the insulating layer and into the first gate lobe, wherein the first gate contact has a first length extending parallel to a longitudinal direction of the trench that is greater than a first width perpendicular to the first length; and
a second gate contact extending through the insulating layer and into the second gate lobe, wherein the second gate contact has a second length extending parallel to the longitudinal direction of the trench that is greater than a second width perpendicular to the second length.

2. The integrated circuit transistor device of claim 1, wherein the first and second gate contacts are in a lateral side-by-side arrangement.

3. The integrated circuit transistor device of claim 1, wherein the first and second gate contacts are offset from each other in a longitudinal direction of the trench.

4. The integrated circuit transistor device of claim 3, wherein no cross section through said trench in a plane perpendicular to the longitudinal direction of the trench passes through both the first gate contact and the second gate contact.

5. The integrated circuit transistor device of claim 1, wherein the polygate region further comprises a bridge region extending over the polyoxide region and electrically coupling the first gate lobe to the second gate lobe.

6. The integrated circuit transistor device of claim 5, wherein a portion of the bridge region laterally extends between the first and second gate contacts.

7. The integrated circuit transistor device of claim 1, wherein the polyoxide region includes a void, and wherein each of the first and second gate contacts is offset from the void in a lateral direction of the trench.

8. The integrated circuit transistor device of claim 1, further comprising a metal layer extending over the insulating layer and electrically connecting the first and second gate contacts.

9. The integrated circuit transistor device of claim 1, further comprising a gate insulator layer along walls of the trench and positioned between each of the first and second gate lobes and the semiconductor substrate.

10. The integrated circuit transistor device of claim 1, further comprising a polysource region within said trench, wherein the polysource region is longitudinally aligned with the polyoxide region.

11. The integrated circuit transistor device of claim 10, wherein said polyoxide region is an oxidized portion of said polysource region.

12. The integrated circuit transistor device of claim 1, wherein each of the first and second gate contacts comprises a Titanium-Titanium Nitride barrier layer and a Tungsten plug.

13. An integrated circuit transistor, comprising:
a semiconductor substrate providing a drain;
a first doped region buried in the semiconductor substrate providing a body;
a second doped region in the semiconductor substrate providing a source, wherein the second doped region is adjacent the first doped region;
a trench extending into the semiconductor substrate and passing through the first and second doped regions;
a polyoxide region within the trench;
a polygate region within the trench, said polygate region comprising: a first gate lobe on a first side of the polyoxide region and a second gate lobe on a second side of the polyoxide region opposite said first side;
an insulating layer extending over the first doped region and trench; and
a pair of gate contacts for said trench, said pair of gate contacts comprising:
a first gate contact extending through the insulating layer and into the first gate lobe; and
a second gate contact extending through the insulating layer and into the second gate lobe;
wherein the polyoxide region is aligned with a center of the trench and wherein a center of each of the first and second gate contact is located between a center of the corresponding first and second gate lobe and the center of the trench and in contact with the polyoxide region.

14. The integrated circuit transistor device of claim 13, wherein the first and second gate contacts are in a lateral side-by-side arrangement.

15. The integrated circuit transistor device of claim 13, wherein the first and second gate contacts are offset from each other in a longitudinal direction of the trench.

16. The integrated circuit transistor device of claim 15, wherein no cross section through said trench in a plane perpendicular to the longitudinal direction of the trench passes through both the first gate contact and the second gate contact.

17. An integrated circuit transistor device, comprising:
a semiconductor substrate providing a drain;
a first doped region buried in the semiconductor substrate providing a body;
a second doped region in the semiconductor substrate providing a source, wherein the second doped region is adjacent the first doped region;
a trench extending into the semiconductor substrate and passing through the first and second doped regions;
an insulated polysource region within the trench;
a polyoxide region within the trench and aligned with said insulated polysource region, wherein said polyoxide region includes void;
a first insulated gate lobe on a first side of the polyoxide region;
a second insulated gate lobe on a second side of the polyoxide region opposite said first side;
a first gate contact extending into the first gate lobe, said first gate contact laterally offset from a longitudinal center of the trench such that a depth of the first gate contact does not reach said void; and
a second gate contact extending into the second gate lobe, said second gate contact laterally offset from the longitudinal center of the trench such that a depth of the second gate contact does not reach said void.

18. The integrated circuit transistor device of claim 17, further comprising an insulating layer extending over the first doped region and trench, wherein said first and second gate contacts extend through the insulating layer and are laterally insulated from each other at a level of the insulating layer by a portion of said insulating layer.

19. The integrated circuit transistor device of claim 17, wherein the first and second gate contacts are in a lateral side-by-side arrangement.

20. The integrated circuit transistor device of claim 17, wherein the first and second gate contacts are offset from each other in a longitudinal direction of the trench.

21. The integrated circuit transistor device of claim 18, further comprising a bridge region extending over the polyoxide region and electrically coupling the first insulated gate lobe to the second insulated gate lobe.

22. The integrated circuit transistor device of claim 21, wherein the bridge region laterally extends between the first and second gate contacts.

23. The integrated circuit transistor device of claim 17, wherein said polyoxide region is an oxidized portion of said insulated polysource region.

24. An integrated circuit transistor device, comprising:
a semiconductor substrate providing a drain;
a first doped region buried in the semiconductor substrate providing a body;
a second doped region in the semiconductor substrate providing a source, wherein the second doped region is adjacent the first doped region;
a trench extending into the semiconductor substrate and passing through the first and second doped regions;
a polyoxide region within the trench;
a polygate region within the trench, said polygate region comprising: a first gate lobe on a first side of the polyoxide region, a second gate lobe on a second side of the polyoxide region opposite said first side and a bridge region extending over the polyoxide region and electrically coupling the first insulated gate lobe to the second insulated gate lobe;
an insulating layer extending over the first doped region and trench; and
a gate contact extending through the insulating layer and into the first gate lobe for said trench, and wherein said bridge region laterally extends away from said gate contact, wherein the gate contact has a length extending parallel to a longitudinal direction of the trench that is greater than a width perpendicular to the length.

25. An integrated circuit transistor device, comprising:
a semiconductor substrate providing a drain;
a first doped region buried in the semiconductor substrate providing a body;
a second doped region in the semiconductor substrate providing a source, wherein the second doped region is adjacent the first doped region;

a trench extending into the semiconductor substrate and passing through the first and second doped regions;

a polyoxide region within the trench;

a polygate region within the trench, said polygate region comprising: a first gate lobe on a first side of the polyoxide region, a second gate lobe on a second side of the polyoxide region opposite said first side and a bridge region extending over the polyoxide region and electrically coupling the first insulated gate lobe to the second insulated gate lobe;

an insulating layer extending over the first doped region and trench; and a gate contact extending through the insulating layer and into the first gate lobe for said trench, and wherein said bridge region laterally extends away from said gate contact;

wherein the polyoxide region includes a void, and wherein the gate contact is offset from the void in a lateral direction of the trench.

* * * * *